United States Patent [19]
Dentai

[11] Patent Number: 5,747,861
[45] Date of Patent: May 5, 1998

[54] WAVELENGTH DISCRIMINATING PHOTODIODE FOR 1.3/1.55 µM LIGHTWAVE SYSTEMS

[75] Inventor: Andrew Gomperz Dentai, Atlantic Highlands, N.J.

[73] Assignee: Lucent Technologies Inc., Murray Hill, N.J.

[21] Appl. No.: 778,922

[22] Filed: Jan. 3, 1997

[51] Int. Cl.$^6$ .................. H01L 31/0232; H01L 31/00
[52] U.S. Cl. ............................ 257/435; 257/436; 257/440
[58] Field of Search ................................ 257/458, 440, 257/432, 435, 436

[56] References Cited

U.S. PATENT DOCUMENTS 4,213,138  7/1980  Campbell et al. .
4,962,304  10/1990  Stapelbroek et al. .
5,329,136  7/1994  Goosen .
5,380,669  1/1995  Norton .
5,627,383  5/1997  Cunningham et al. .

*Primary Examiner*—Stephen Meier

[57] ABSTRACT

The specification describes a discriminating photodiode for detection of 1.55 µm signals used in wavelength multiplexed systems operating with 1.3 µm and 1.55 µm wavelengths. The device uses a semiconductor layered structure to absorb photons from the 1.3 µm signal, and annihilate the photogenerated carriers, while passing the 1.55 µm light to a photodetecting junction beneath the layered structure.

15 Claims, 2 Drawing Sheets

WAVELENGTH DISCRIMINATING PHOTODIODE FOR 1.3/1.55 μM LIGHTWAVE SYSTEMS

FIELD OF THE INVENTION

This invention relates to photodiodes useful in wavelength division multiplexed systems using 1.3 μm and 1.55 μm wavelengths.

BACKGROUND OF THE INVENTION

Lightwave communications systems have largely replaced copper wire systems due to the high information handling capacity of lightwave signals. Most of the early advances in lightwave system capacity involved increases in pulse rates, and multiple channels which were implemented in the time domain. Relatively early in lightwave system development it was recognized that wavelength division approaches were attractive, and these approaches gained impetus with the discovery of two wavelengths, 1.3 μm and 1.55 μm, where optical transmission is highly efficient in silica glass fibers, and the follow-on development of fiber design and components that operate efficiently at these wavelengths. Thus systems rapidly evolved using multiplexed signals at these wavelengths. Systems were developed using multiplexing of wavelengths closely spaced in the spectrum about 1.3 μm and/or 1.55 μm, but the two channel implementation offers the advantage that the wavelengths are sufficiently close to allow low loss long distance transmission, but sufficiently spaced in the spectrum to allow effective signal discrimination.

While the 0.25 μm band differential allows the signals to be effectively separated, the wavelengths are too close to detect separately without some means of channel filtering. This is the case even in systems with 1.3 μm signals downstream and 1.55 μm signals upstream because enough reflection occurs at splices and terminations to cause unacceptable crosstalk. The wavelengths are typically separated using a WDM filter or lock-in techniques. These components add complexity and cost to the system.

It has been proposed to use photodetectors that inherently respond, or detect, only one of the two wavelengths present. This approach can be easily implemented for detection of the short (1.3 μm) wavelength only, where the detector is insensitive to the 1.55 μm wavelength by judicious selection of the bandgap of the semiconductor. However, the same approach is ineffective for detecting the longer wavelength because any semiconductor that absorbs the long wavelength inherently will also absorb the shorter signal wavelength.

Thus although it is clearly desirable to have photodetectors with integrated means for signal discrimination in a 1.3 μm/1.55 μm wavelength multiplexed system, devices which detect the 1.55 μm signal only have so far been unavailable.

STATEMENT OF THE INVENTION

I have developed a discriminating photodiode (DPD) with a heavily-doped superlattice window integrated with the PIN diode that filters out 1.3 μm light and traps carriers generated in the superlattice, without substantially reducing response of the DPD at 1.55 μm. Use of this device in wavelength multiplexed systems can eliminate or reduce crosstalk without the need for filtering components, or it can supplement those components to further improve signal discrimination in high performance systems.

DETAILED DESCRIPTION

The following detailed embodiment of the invention is given by way of example and the specific structure described was used to demonstrate the principle of the invention. The details are given to enable one to achieve the objective of the invention, but are in no way limiting with respect to the scope of the invention.

Figure 1:
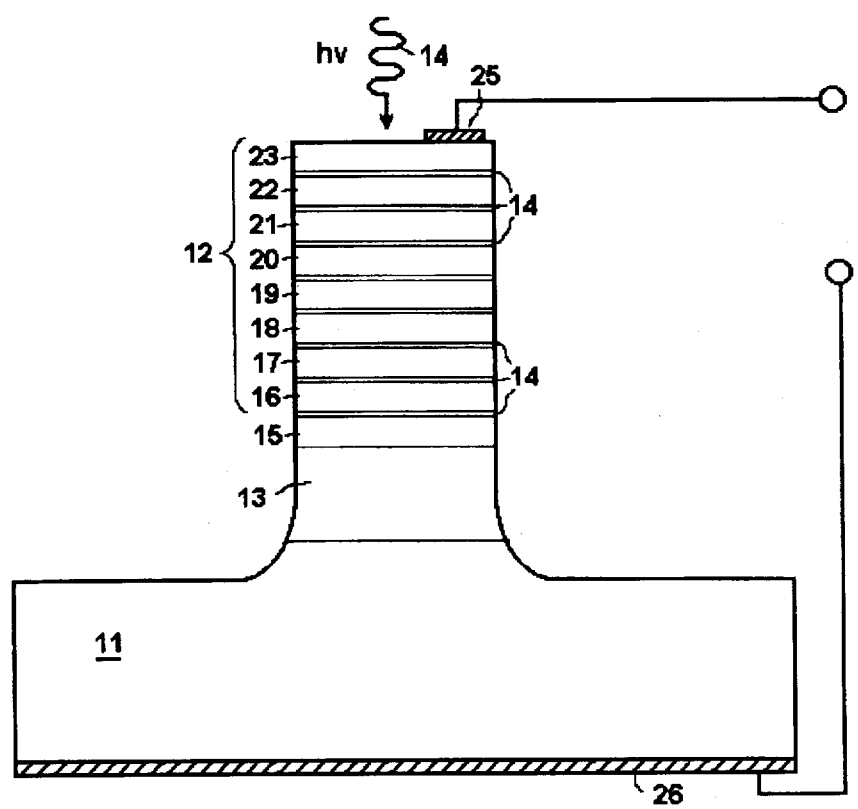
FIG. 1 is a schematic representation of a DPD according to the invention.

Referring to FIG. 1, an indium phosphide substrate 11 is shown with a stacked mesa superlattice structure overlying the substrate. The indium phosphide substrate is <100> oriented, sulfur-doped, n-type material with doping density in the range $10^{17}$ cm$^{-3}$ to $10^{19}$ cm$^{-3}$. The absorbing layer 13 of the PIN diode and the first p+layer 15 complete the PIN diode for detecting the 1.55 μm signal.

The first active layer 13 is undoped InGaAs (n=2×$10^{15}$ cm$^{-3}$) that is essentially lattice matched to the InP substrate. InP has a lattice parameter of 5.869 Angstroms. Some of the compounds that are suitably matched to InP are: $In_{0.75}Ga_{0.25}As_{0.5}$, $P_{0.5}$, $In_{0.6}Ga_{0.4}As_{0.85}P_{0.15}$, $In_{0.53}Ga_{0.47}As$. In the device made to demonstrate the principles of this invention the latter ternary material, which has a bandgap of 0.75 eV, was chosen. Layer 13 is the absorbing layer for the 1.55 μm light signal component of the incident light, which is shown schematically at 14. The light signal at 14 contains both 1.3 μm and 1.55 μm wavelengths. To absorb a significant fraction of the 1.55 μm radiation, layer 13 should have a thickness of at least 1 μm, and unless other absorbing enhancement means are employed, the thickness of this layer is preferably greater than approximately 2.0 μm. In the structure of FIG. 1 layer 13 is 2.4 μm.

P-type layer 15 is InGaAsP and forms, with n-type layer 13, the p-n junction for collecting the carriers generated by the 1.55 μm light absorbed in layer 13. The thickness of layer 15 is not critical. In the structure of FIG. 1 the thickness of layer 15 is approximately 0.8 μm.

Layers 16–23 comprise the absorbing means for the 1.3 μm light. These layers, indicated generally at 12 in FIG. 1, are heavily doped InGaAsP to capture incident 1.3 μm photons. The electrode layers for the device are shown at 25 and 26.

The structure 12 is designed so that hole-electron pairs generated by absorption of 1.3 μm light in layers 16–23 recombine before being collected by the p-n junction. To achieve this the absorbing layer is sectioned into multiple layers, and the absorbing section is further provided with heavily doped InP interlayers 24 separating the absorbing layers. The preferred doping level of the InP interlayers is greater than $10^{18}$ cm$^{-3}$. The InP interlayers have a large bandgap, i.e 1.35 eV, and therefore do not absorb the 1.3 μm light. However, they are effective barriers to the photogenerated carriers from the 1.3 μm absorbed light in the absorbing layers, and to a large extent prevent carrier propagation through the layered structure to the p-n junction. The thickness of the InP interlayers is not critical but in the device shown in FIG. 1 are approximately 0.1 μm. The many interfaces in the structure multiply the number of traps in the structure so that most of the photogenerated carriers from the 1.3 μm light are trapped and recombine, thus effectively extinguishing the 1.3 μm signal and separating it from the 1.55 μm signal.

The InP interlayers function simply as barriers for free carriers so it will occur to those skilled in the art that other large bandgap materials, e.g. InGaP, can be chosen. Accordingly, it is meaningful to define the interlayers as having a bandgap larger than 1.3 eV.

The number and thickness of the layers in the multilayer absorbing structure 12 can vary over wide limits. In the structure of FIG. 1, layers 16–23 are approximately 0.8 μm thick. The overall thickness of the multilayer absorbing structure is preferably at least 3.0 μm. As the thickness of the absorbing structure is increased beyond 3.0 μm, absorption of 1.3 μm light increases as desired. However, some 1.55 μm radiation is also absorbed in these layers resulting in a trade-off, and a point beyond which further increases in the thickness of the absorbing layer, and further improvement in 1.3 μm light absorption, is offset by excessive attenuation of the 1.55 μm signal component. In the structure shown, the multilayer structure 12 was 6.2 μm thick, and showed no evidence of excessive absorption of the 1.55 μm signal. It would be expected that an absorbing structure useful in the context of this invention would have a thickness in the range of 3.0 to 10.0 μm. Although the number of layers useful in this structure can vary, for efficient recombination of photogenerated carriers, and to block carriers from reaching the p-n junction, at least 3 absorbing layers and 2 barrier interlayers are preferred. In view of the overall dimensional limits just described for the absorbing structure, this suggests that the individual absorbing layers have a thickness of less than approximately 3.0. A lower limit on the layer thickness is not meaningful except that layers less than 0.3 μm requires an absorbing structure with more than ten layers to reach an overall structure thickness of 3.0 μm, so it is evident that the lower limit is a matter of practical convenience, i.e complexity and cost.

In the structure shown in FIG. 1, layers 15 and 16 are p-type, heavily zinc doped, with a doping level of $4 \times 10^{18}$ cm$^{-3}$. The composition of layers 15 and 16 is $In_{0.73}Ga_{0.27}As_{0.6}P_{0.4}$. Layers 17–23 are p-type with a doping level of $6 \times 10^{18}$ cm$^{-3}$, and composition: $In_{0.65}Ga_{0.35}As_{0.78}P_{0.22}$. These layers are not precisely lattice matched and thus are expected to be strained. The presence of strains in these layers should increase the defect density and make carrier trapping of the unwanted 1.3 μm generated carriers more effective.

Layers 15 and 16 were grown with a composition different from layers 17–23. Varying the composition of the layers in the absorbing structure is thus demonstrated as effective and wide choices of compositional variations are possible. However, it is clearly not necessary to have layers of different composition in this section of the device, and it would be expected that in commercial practice these layers would be essentially the same. The important property for these layers is the band gap wavelength which should be greater than 1.3 μm, and preferably greater than 1.4 μm. In the structure of FIG. 1, layers 15 and 16 have a bandgap wavelength of 1.31 μm, and layers 17–23 have a bandgap wavelength of 1.46 μm. It will be recognized by those skilled in the art that layers 17–23, with a higher bandgap wavelength, will provide more complete and reliable absorption of the 1.3 μm signal than the lower bandgap wavelength material. Therefore the higher bandgap material is preferred. It is desirable for the absorbing layers to be very transparent to the 1.55 μm signal. Even though the bandgap wavelength of layers 17–23 is very close to the 1.55 signal wavelength, the bandedge in these materials is very sharp so undue absorption of the 1.55 μm signal is not at risk.

For the demonstration of this invention the layered structure was fabricated using low pressure Metal Organic Vapor Phase Epitaxy (MOVPE) processing. This technique has become an important epitaxial semiconductor growth technique and is especially useful in preparing multi-layer heterostructures, e.g. superlattice structures, with well controlled layer thickness and composition. Layers are grown in a continuous in situ fashion with the layer composition controlled by the gas feed to the reaction chamber. Typically group III alkyls and group V hydrides are introduced in controlled amounts into a reaction chamber with the substrate on a heated carbon susceptor. Growth takes place by reaction of the III–V gases at the hot surfaces. Temperatures at the growth surface are typically in the range 500°–650° C. Precise process conditions are dependent on the reactor chosen for the process. In the demonstration described here, a horizontal non-rotating reactor was used, with a pressure of 100 torr and a temperature of 625° C. Details on reactors and processing are described by M. Razeghi in "The MOCVD Challenge, Volume 1: A Survey of GaInAsP - InP For Photonic and Electronic Applications", pp. 8–20 et seq., Adam Hilger, Bristol and Philadelphia, which is incorporated by reference herein.

While MOVPE was chosen to demonstrate the efficacy of the invention the structure of FIG. 1 can be made by other techniques, notably CVD. While MOVPE produces low defect layers, the defect density in the layered structure 12 of FIG. 1 is advantageously high. Therefore the growth technique is not critical. CVD offers the advantage of more rapid growth.

The layered mesa structure shown in FIG. 1 was formed by growing layers on substrate 11 to form a layered semiconductor wafer, then masking the stacked superlattice regions, and etching the wafer to produce the mesa structure shown in FIG. 1. Techniques to produce such mesa structures, i.e. the masking and etching steps are well known in the art and the devices described here followed standard mesa-type PIN processing steps. Mesas 200 μm in diameter with 75 μm diameter p-contact areas were defined by photolithography and were etched by a non-selective wet etch (Br-methanol) to a depth of approximately 10 μm. Standard ohmic p- and n- contacts, shown at 25 and 26 in FIG. 1, were applied by evaporation and plating, and the wafers were sawed into 500×500 μm chips.

The chips were mounted on an experimental submount with conducting epoxy, for testing. To evaluate the spectral response and wavelength discrimination of the diodes, light from a monochromator was chopped at 400 Hz and focused on the p-side of the PIN mesa structure by a microscopic objective lens. The zero-bias photocurrent was detected by a lock-in amplifier and the wavelength vs. photocurrent curves were collected by computer.

Figure 2:
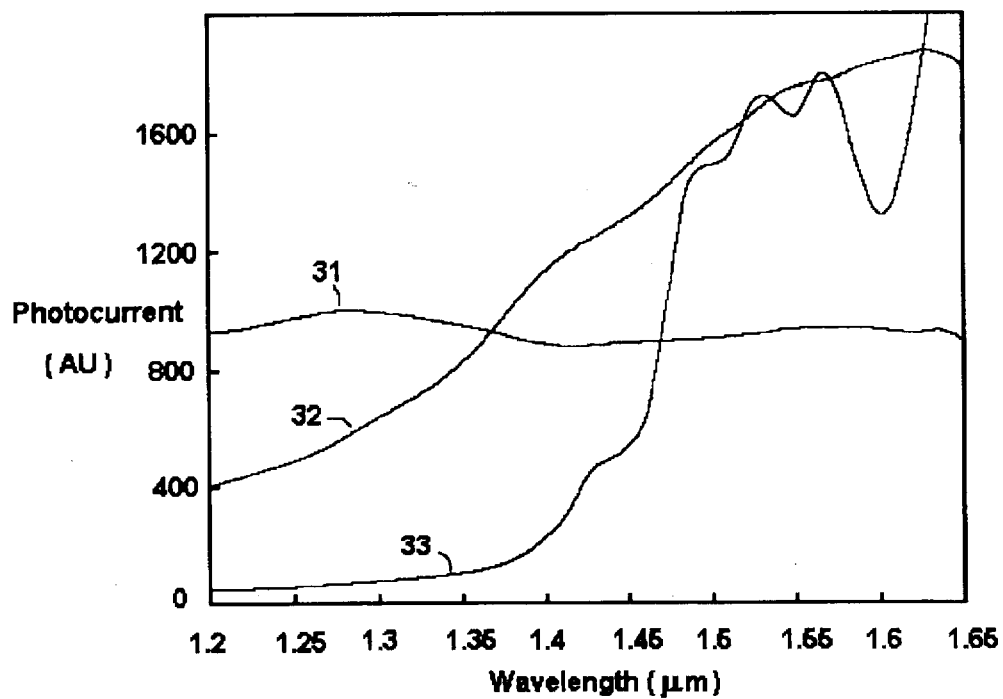
FIG. 2 is a plot of photocurrent vs. wavelength showing the spectral response at 1.3 μm and 1.55 μm for three different photodiodes including the DPD of FIG. 1.

Results of these measurements are given in FIG. 2. Curve 31 shows photocurrent response from a standard InGaAs PIN photodiode with a p-type InP layer. As is evident, no discrimination occurs in the standard InGaAs PIN device. Curve 32 shows the photoresponse from a PIN structure made according to the invention with a single absorbing layer 2.0 μm thick. The absorbing layer in this structure was a InGaAsP ternary material with a bandgap wavelength of 1.38 μm. This device shows some discrimination and effectively demonstrates the principle of the invention. A better result is shown by curve 33, which was obtained with the structure of FIG. 1 in which the multilayer absorbing structure was 6.2 μm thick,. i.e. in the preferred range. Here the discrimination between the 1.3 μm signal and the 1.55 μm signal is very sharp. In this device the crosstalk rejection was 18.5 dB.

The experiments conducted in this work indicate that it should be possible to further increase the crosstalk rejection ratio, by further optimizing the layered absorbing structure 12, without decreasing the quantum efficiency of the photodiode, if systems considerations require it.

It will be appreciated by those skilled in the art that a significant aspect of the invention is the integration into a single semiconductor device both the photodetector for the 1.55 μm signal and the means for separating out the 1.3 μm signal. The integrated device has as essential components a substrate, a p-n junction photodetector for detecting the 1.55 μm signal, and a multilayer semiconductor absorbing structure for separating the 1.3 μm signal. The term integrated together or integrated therewith as used herein and in the appended claims is intended to define a semiconductor substrate and overlying semiconductor features and interconnections as a category of devices well known in the art.

It will also be understood by those skilled in the art that in practice the DPD of the invention would be incorporated into a light wave system including one or more optical fibers that carry at least two optical signals at 1.3 μm and 1.55 μm. The signals may be multiplexed to traverse the fiber in the same direction, or may travel in opposite directions on the fiber. In the latter case, the photodiode of the invention is useful to discriminate the 1.55 μm signal from noise, e.g. reflections, from the 1.3 μm signal.

Figure 3:
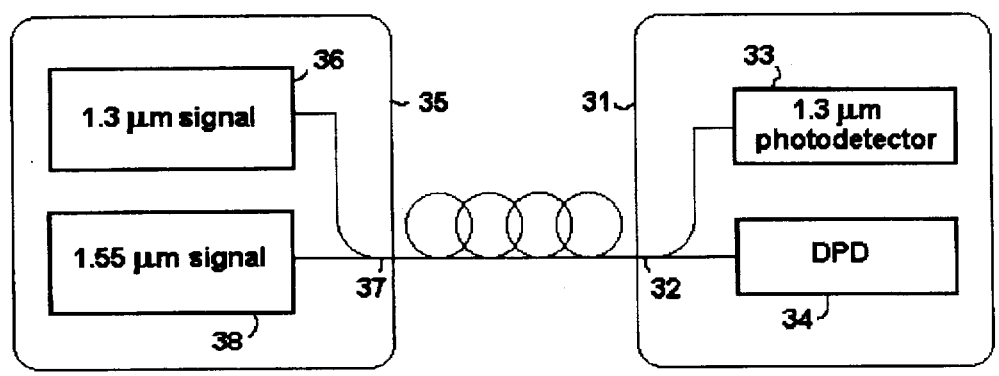
FIG. 3 is a schematic representation of a lightwave system employing the DPD of the invention.

A typical lightwave system using the DPD of the invention is illustrated schematically in FIG. 3. A receiver station, indicated generally at 31, in a lightwave system employing the DPD will include the receiving end of an optical fiber 32, a 1.3 μm photodetector 33 coupled to the optical fiber, and the DPD 34 coupled to the optical fiber. The entire lightwave system will also have a transmitter indicated generally at 35, including a modulated source of 1.3 μm light 36 coupled to the transmitting end 37 of the optical fiber, and a modulated source of 1.55 μm light 38 also coupled to the transmitting end of the fiber.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A discriminating photodiode comprising:

a semiconductor substrate, a photodiode overlying the substrate and integrated therewith, said photodiode being responsive to light at a wavelength of 1.55 μm, the invention characterized by a multilayer absorbing structure overlying said photodiode and integrated therewith, said multilayer absorbing structure comprising multiple absorbing layers of semiconductor material having a bandgap wavelength greater than 1.3 μm, with each layer separated by a barrier layer of semiconductor material having a bandgap greater than 1.3 eV.

2. The photodiode of claim 1 in which the multilayer structure comprises at least three absorbing layers with a thickness of less than 3.0 μm.

3. The photodiode of claim 2 in which the absorbing layers comprise InGaAsP.

4. The photodiode of claim 3 in which the barrier layers comprise InP.

5. The photodiode of claim 2 in which the absorbing layers have a bandgap wavelength greater than 1.4 μm.

6. A lightwave system comprising a photodiode and an optical fiber carrying a light signal, means for operatively coupling the light signal from the optical fiber to the photodiode, said light signal comprising light at least two wavelengths, said at least two wavelengths including light at 1.3 μm and 1.55 μm, said photodiode comprising a substrate, a PIN junction overlying said substrate and integrated therewith, and a multilayer semiconductor absorbing structure comprising multiple absorbing layers of semiconductor material having a bandgap wavelength greater than 1.3 μm, with each layer separated by a barrier layer of semiconductor material having a bandgap greater than 1.3 eV.

7. The photodiode of claim 6 in which the multilayer structure comprises at least three absorbing layers with a thickness of less than 3.0 μm.

8. The photodiode of claim 7 in which the absorbing layers comprise InGaAsP.

9. The photodiode of claim 8 in which the barrier layers comprise InP.

10. The photodiode of claim 7 in which the absorbing layers have a bandgap wavelength greater than 1.4 μm.

11. The lightwave system comprising a lightwave transmitter, a lightwave receiver, and an optical fiber connecting said transmitter to said receiver, said transmitter comprising a. a 1.3 μm light signal, b. a 1.55 μm light signal, c. means for coupling both said signals into the optical fiber, said receiver comprising a photodiode coupled to said optical fiber, said photodiode comprising:

i. a substrate, ii. a PIN junction overlying said substrate and integrated therewith, said PIN junction being responsive to said 1.55 μm light, and iii. a multilayer semiconductor absorbing structure comprising multiple absorbing layers of semiconductor material having a bandgap wavelength greater than 1.3 μm, and a barrier layer separating each of said multi absorbing layers, said barrier layer comprising a semiconductor material having a bandgap greater than 1.3 eV.

12. The photodiode of claim 11 in which the multilayer structure comprises at least three absorbing layers with a thickness of less than 3.0 μm.

13. The photodiode of claim 12 in which the absorbing layers comprise InGaAsP.

14. The photodiode of claim 13 in which the barrier layers comprise InP.

15. The photodiode of claim 12 in which the absorbing layers have a bandgap wavelength greater than 1.4 μm.

* * * * *